US011037036B2

(12) United States Patent
Anderson et al.

(10) Patent No.: US 11,037,036 B2
(45) Date of Patent: Jun. 15, 2021

(54) FLUID ACTUATOR REGISTERS

(71) Applicant: Hewlett-Packard Development Company, L.P., Fort Collins, CO (US)

(72) Inventors: Daryl E. Anderson, Corvallis, OR (US); Eric T. Martin, Corvallis, OR (US); James R. Przybyla, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/486,119

(22) PCT Filed: Apr. 14, 2017

(86) PCT No.: PCT/US2017/027717
§ 371 (c)(1),
(2) Date: Aug. 14, 2019

(87) PCT Pub. No.: WO2018/190874
PCT Pub. Date: Oct. 18, 2018

(65) Prior Publication Data
US 2020/0234092 A1 Jul. 23, 2020

(51) Int. Cl.
*G06K 15/02* (2006.01)
*G06K 15/10* (2006.01)
*G06F 9/30* (2018.01)
*G02B 26/00* (2006.01)

(52) U.S. Cl.
CPC ....... *G06K 15/107* (2013.01); *G06F 9/30134* (2013.01); *G06K 15/1803* (2013.01); *G02B 26/004* (2013.01)

(58) Field of Classification Search
None
See application file for complete search history.

(56) References Cited

U.S. PATENT DOCUMENTS

| 4,394,693 A | * | 7/1983 | Shirley | ............... G03F 7/70358 |
| | | | | 346/3 |
| 6,478,396 B1 | | 11/2002 | Schloeman et al. | |
| 6,712,438 B2 | | 3/2004 | Han | |

(Continued)

FOREIGN PATENT DOCUMENTS

| CN | 1524695 | 9/2004 |
| CN | 101184624 | 5/2008 |

(Continued)

OTHER PUBLICATIONS

Rice, H.W., Next-generation Inkjet Printhead Drive Electronics, Jun. 1997, http://www.hpl.hp.com/hpjournal/97jun/jun97a5.pdf >.

*Primary Examiner* — Alejandro Valencia
(74) *Attorney, Agent, or Firm* — Austin Rapp

(57) ABSTRACT

Examples include a fluidic die. The fluidic die may comprise an array of fluid actuators, an actuation data register, a mask register, and actuation logic. The actuation data register may store actuation data that indicates fluid ejectors to actuate for a set of actuation events. The mask register may store mask data that indicates a set of fluid actuators enabled for actuation for a respective actuation event of the set of actuation events. The actuation logic may electrically actuate a subset of the fluid actuators based at least in part on the actuation data register and the mask register for the respective actuation event.

15 Claims, 14 Drawing Sheets

(56) References Cited

U.S. PATENT DOCUMENTS

| | | | |
|---|---|---|---|
| 6,932,453 B2 | 8/2005 | Feinn et al. | |
| 7,445,305 B2 * | 11/2008 | Kondoh | B41J 2/04541 347/10 |
| 7,497,536 B2 * | 3/2009 | Benjamin | B41J 2/04541 347/12 |
| 7,832,842 B2 | 11/2010 | Jackson et al. | |
| 8,939,531 B2 * | 1/2015 | Govyadinov | B41J 2/04541 347/9 |
| 2002/0027575 A1 | 3/2002 | Bruch et al. | |
| 2005/0190217 A1 | 9/2005 | Wade et al. | |
| 2005/0225585 A1 | 10/2005 | Takizawa et al. | |
| 2006/0268056 A1 | 11/2006 | Molinet et al. | |
| 2011/0058420 A1 | 3/2011 | Asauchi et al. | |
| 2011/0234669 A1 | 9/2011 | Benjamin et al. | |
| 2013/0155135 A1 | 6/2013 | Govyadinov et al. | |
| 2015/0124019 A1 | 5/2015 | Cruz-Uribe et al. | |
| 2016/0089885 A1 | 3/2016 | Edelen et al. | |

FOREIGN PATENT DOCUMENTS

| | | |
|---|---|---|
| CN | 101500694 | 8/2009 |
| CN | 101850657 | 10/2010 |
| CN | 102112958 | 6/2011 |
| CN | 102196919 | 9/2011 |
| CN | 102481785 | 5/2012 |
| CN | 106427212 A | 2/2017 |
| IN | 202410 | 2/2007 |
| JP | 07052390 | 2/1995 |
| JP | 07052391 | 2/1995 |
| JP | 09226127 | 9/1997 |
| JP | 10006488 | 1/1998 |
| JP | 3176183 | 6/2001 |
| JP | 2008284786 | 11/2008 |
| JP | 2013022883 | 2/2013 |
| JP | 2013154590 | 8/2013 |
| JP | 2013544678 | 12/2013 |
| WO | WO-2016068894 A1 | 5/2016 |
| WO | WO-2016089371 A1 | 6/2016 |
| WO | WO-2016122528 | 8/2016 |

* cited by examiner

FLUID ACTUATOR REGISTERS

BACKGROUND

Fluidic dies may control movement and ejection of fluid. Such fluidic dies may include fluid actuators that may be actuated to thereby cause displacement of fluid. Some example fluidic dies may be printheads, where the fluid may correspond to ink.

DRAWINGS

Figure 6A:
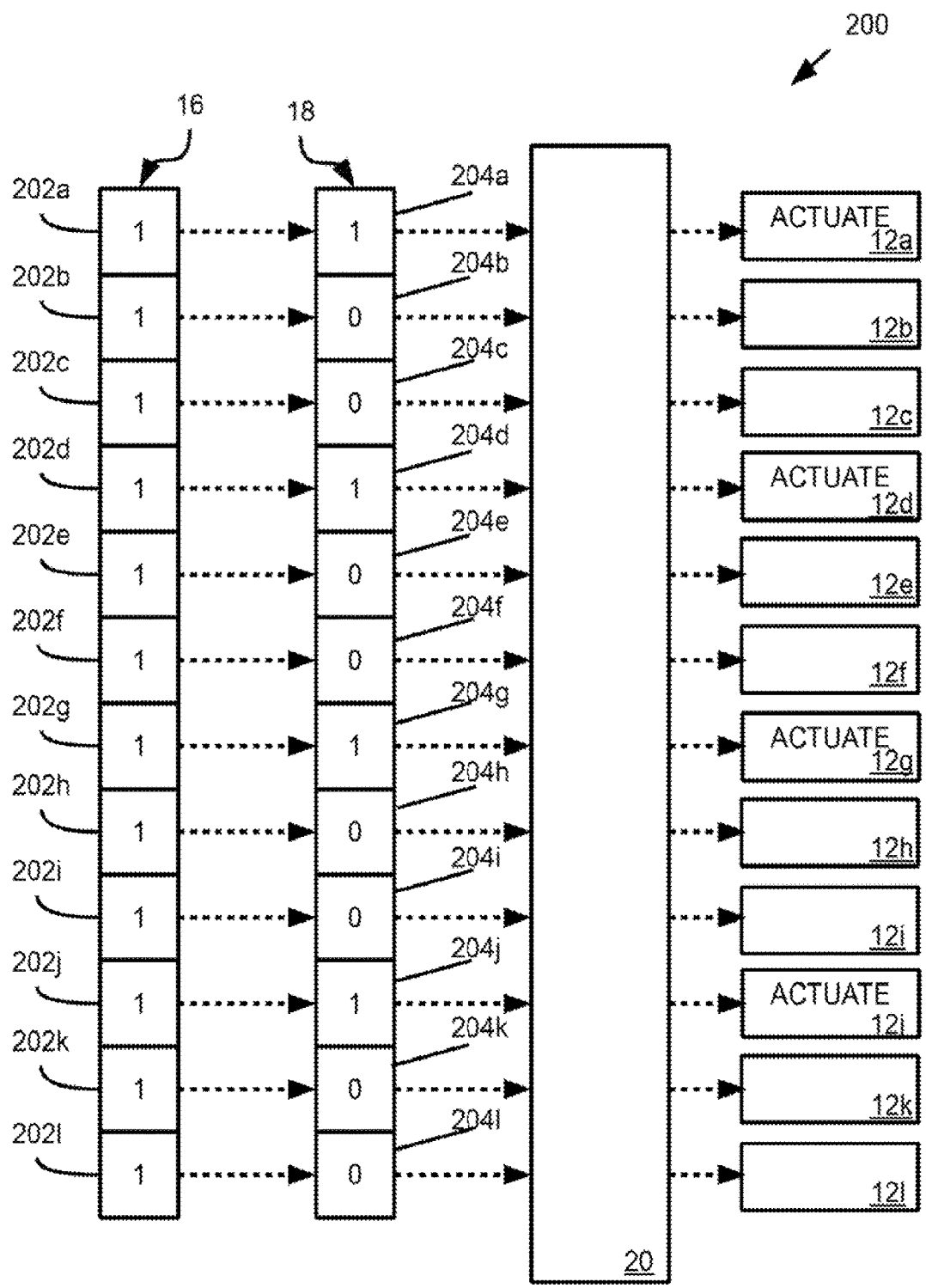
Figure 6B:
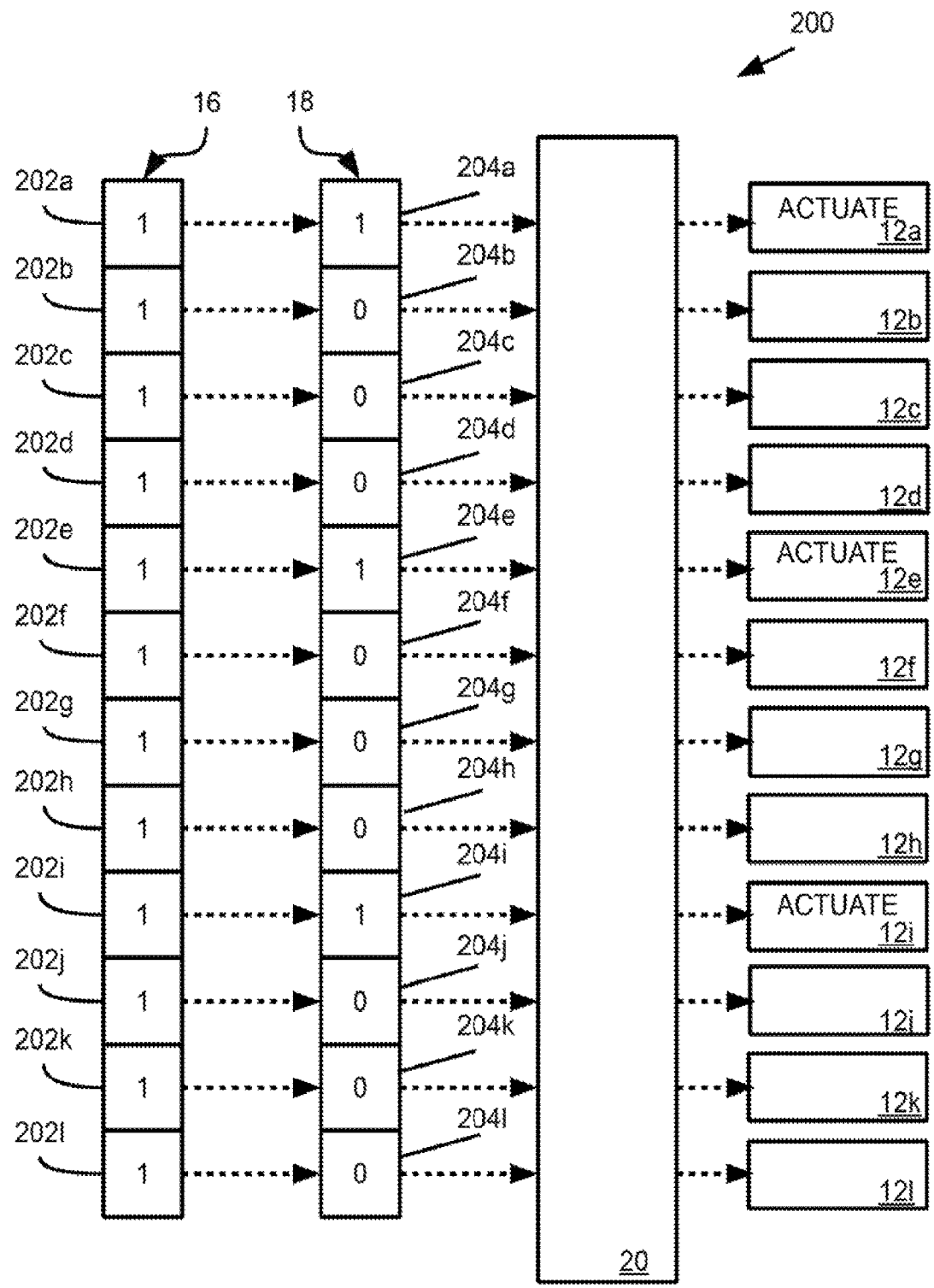
Figure 6C:
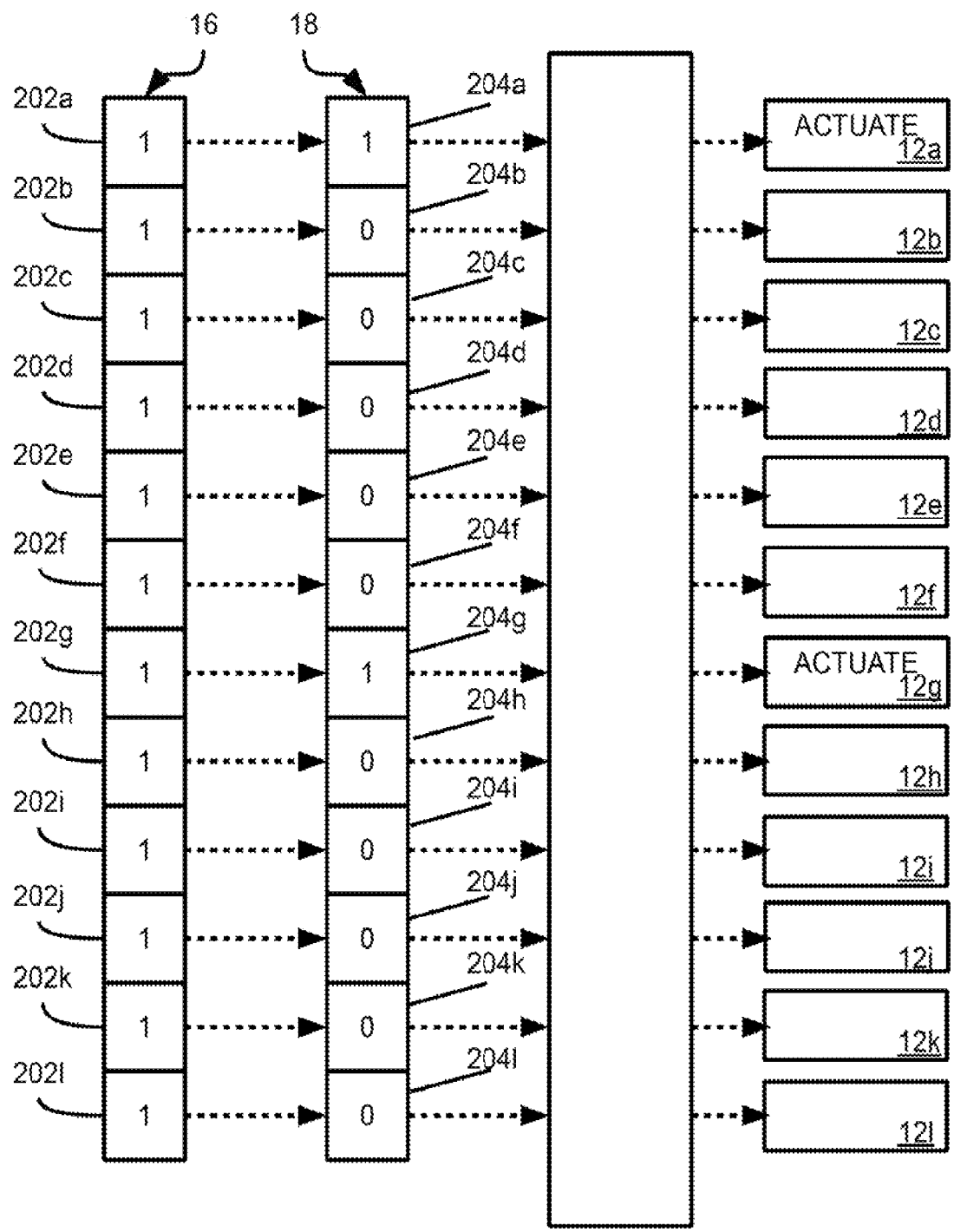

FIGS. 6A-C provide block, diagrams that illustrate example operations of some components of an example fluidic die.

Figure 7A:
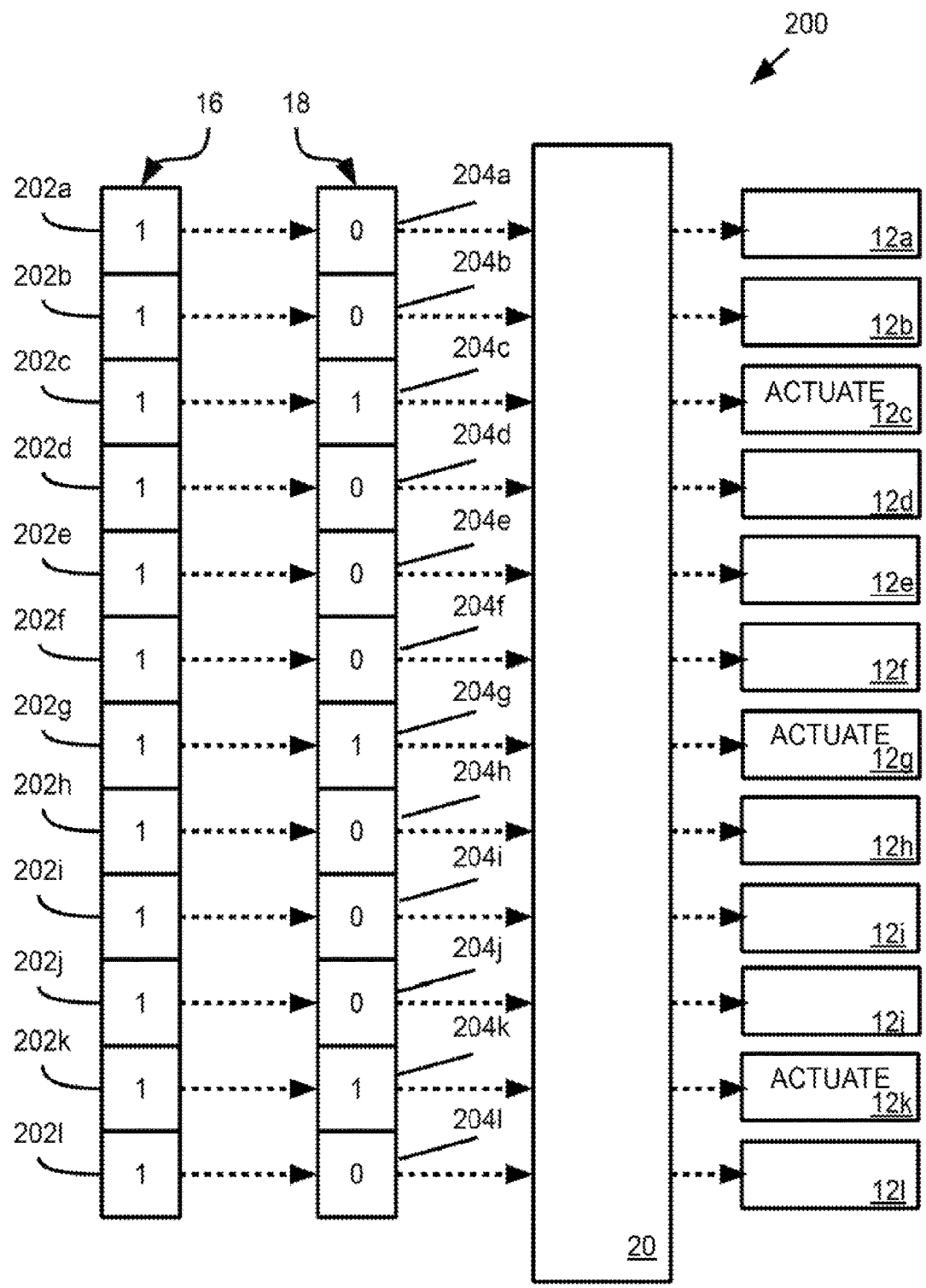
Figure 7B:
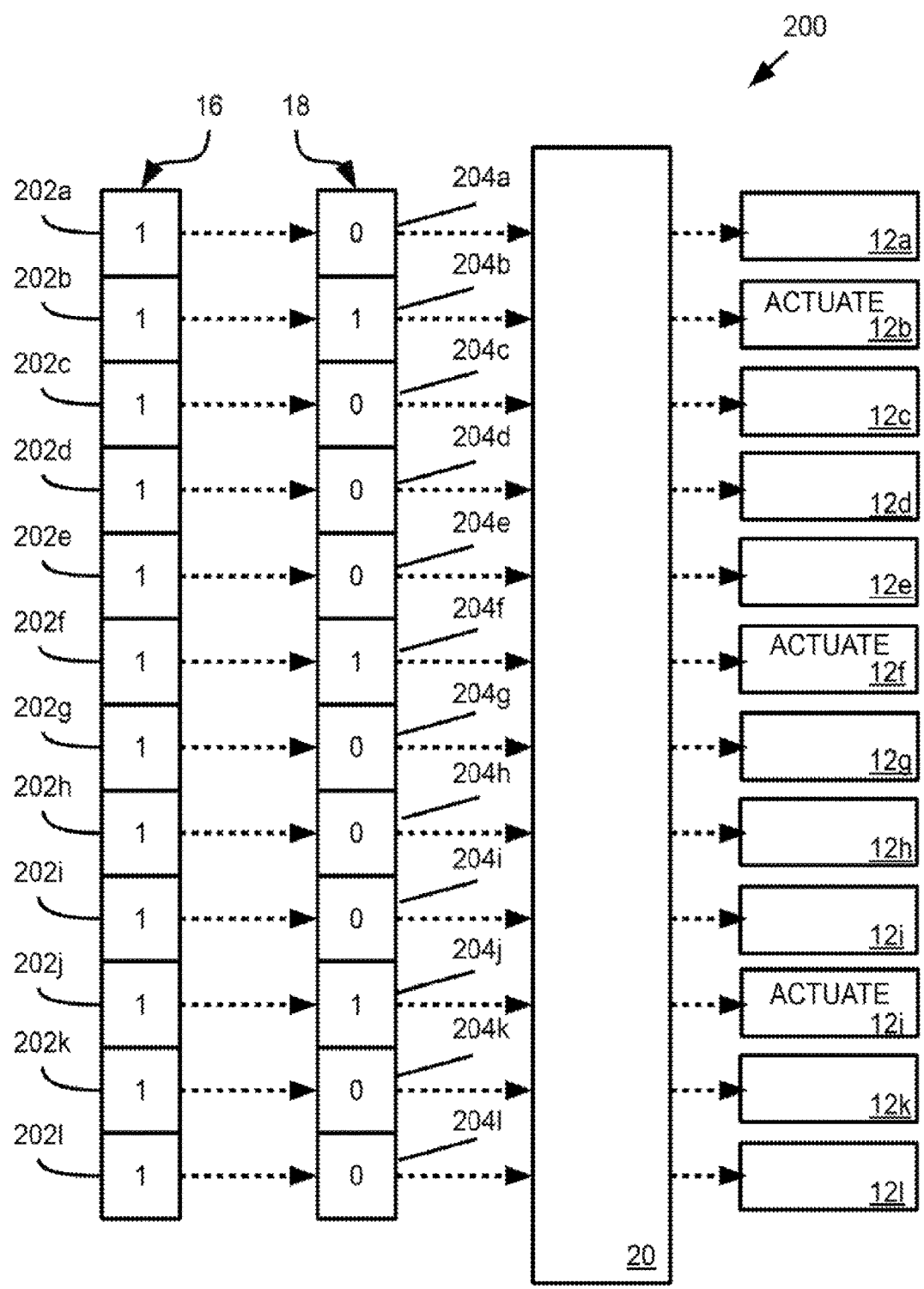
Figure 7C:
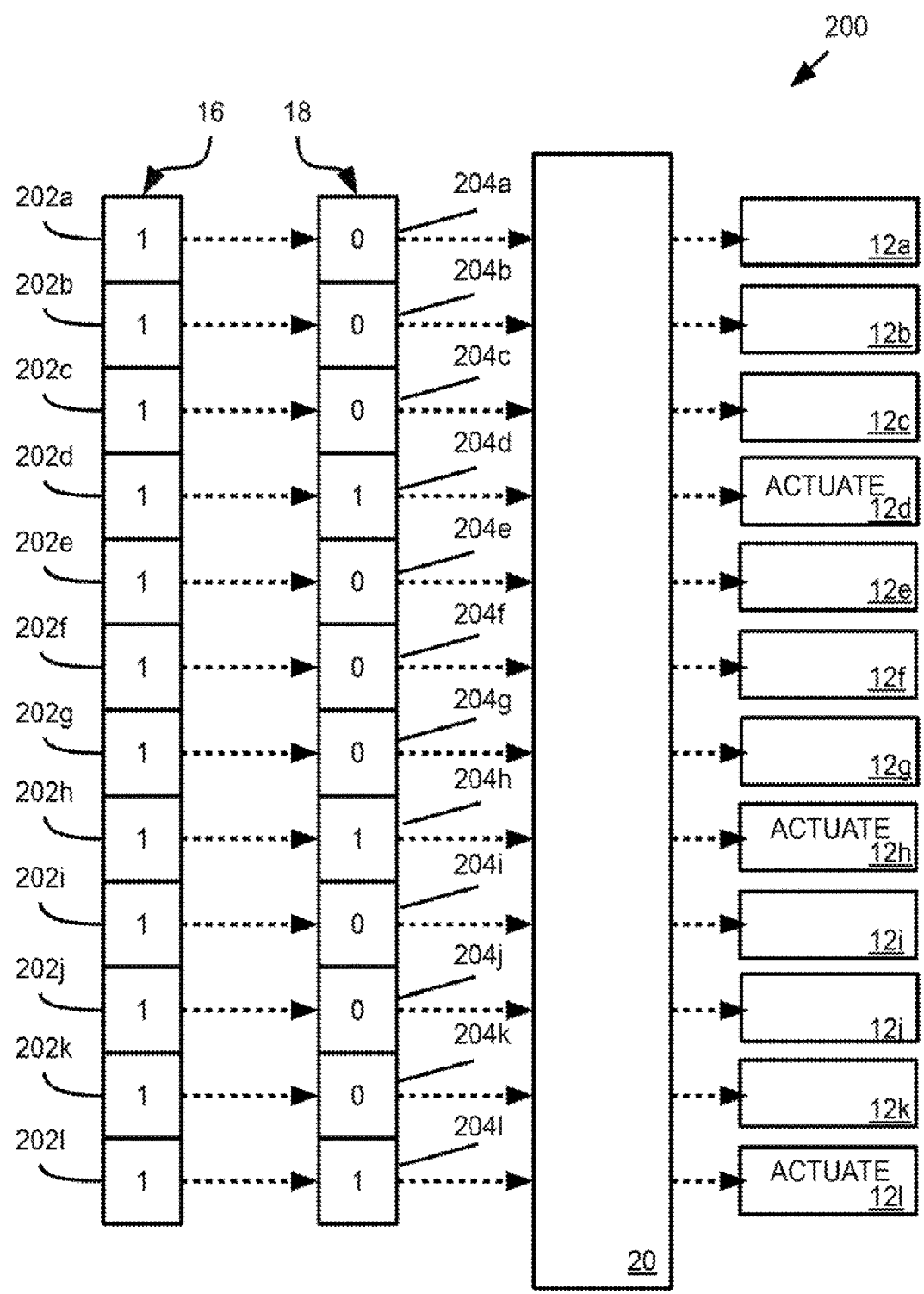

FIGS. 7A-C provide block diagrams that illustrate example operations of some components of an example fluidic die.

Figure 9:
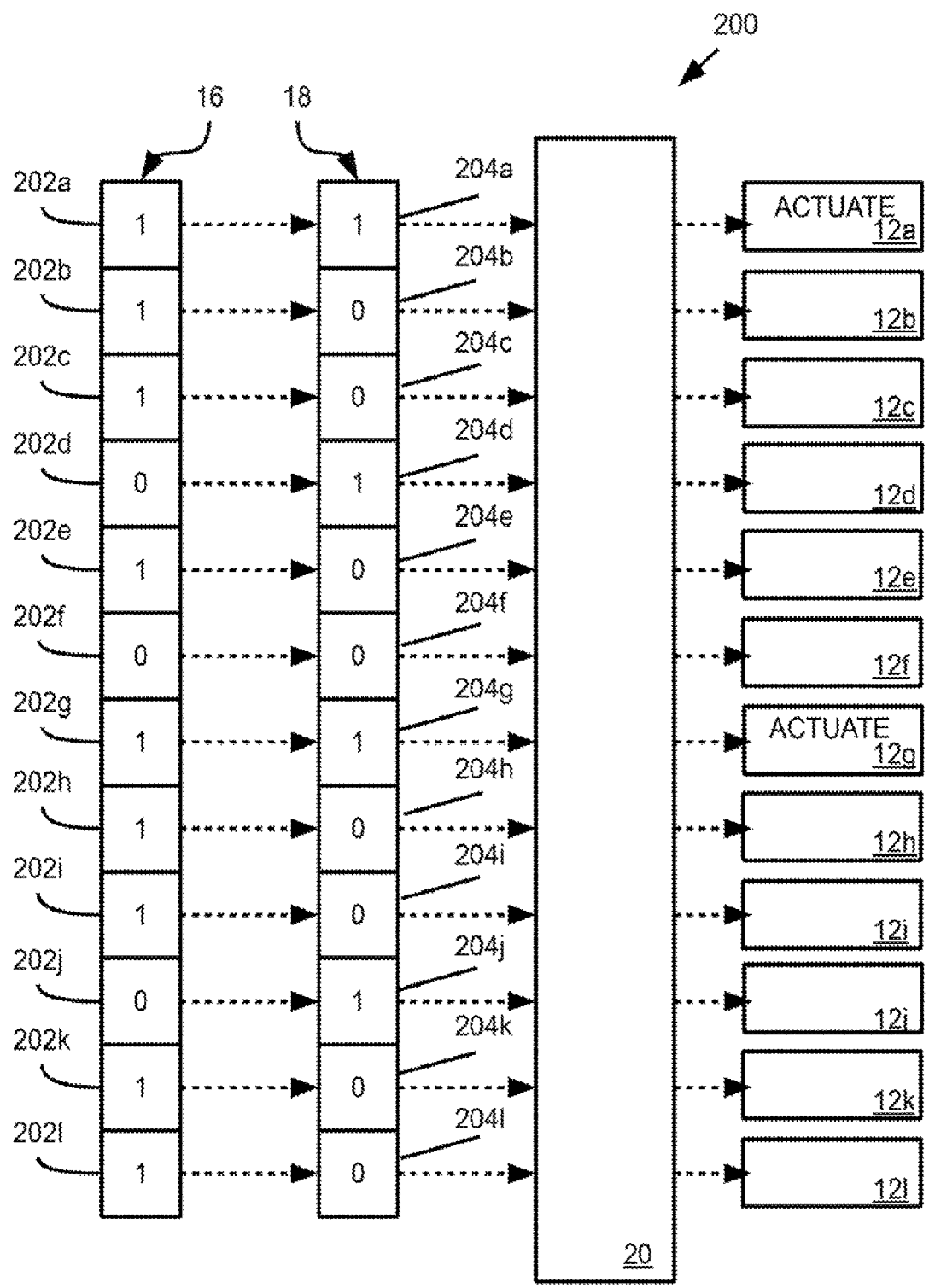

FIG. 9 provides a block diagram that illustrates example operations of some components of an example fluidic die.

Figure 10:
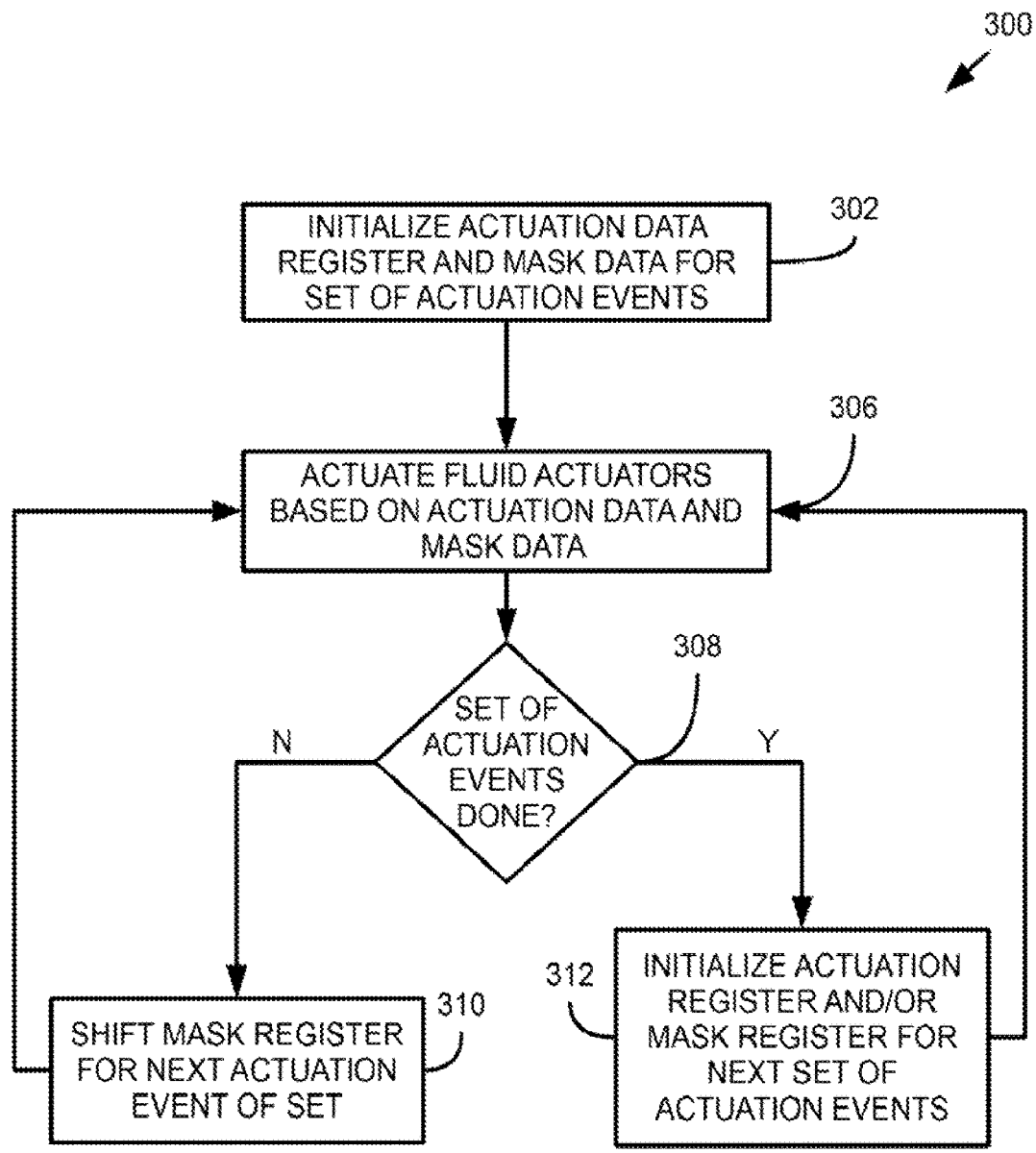

FIG. 10 provides a flowchart that illustrates an example sequence of operations that may be performed by an example fluidic die.

Throughout the drawings, identical reference numbers designate similar, but not necessarily identical, elements. The figures are not necessarily to scale, and the size of some parts may be exaggerated to more clearly illustrate the example shown. Moreover the drawings provide examples and/or implementations consistent with the description: however, the description is not limited to the examples and/or implementations provided in the drawings.

DESCRIPTION

Examples of fluidic dies may comprise fluid actuators. The fluid actuators may include a piezoelectric membrane based actuator, a thermal resistor based actuator, an electrostatic membrane actuator, a mechanical/impact driven membrane actuator, a magneto-strictive drive actuator, or other such elements that may cause displacement of fluid responsive to electrical actuation. Fluidic dies described herein may comprise a plurality of fluid actuators, which may be referred to as an array of fluid actuators. Moreover, an actuation event, as used herein, may refer to concurrent actuation of fluid actuators of the fluidic die to thereby cause fluid displacement. Fluidic dies, as used herein, may correspond to a variety of types of integrated devices with which small volumes of fluid may be pumped, mixed, analyzed, ejected, etc. Such fluidic dies may include fluid ejection dies, such as printheads, additive manufacturing distributor components, digital titration components, and/or other such devices with which volumes of fluid may be selectively and controllably ejected. Other examples of fluidic dies may include fluid sensor devices, lab-on-a-chip devices, and/or other such devices in which fluids may be analyzed and/or processed.

In example fluidic dies, the array of fluid actuators may be arranged, in respective sets of fluid actuators, where each such set of fluid actuators may be referred to as a "primitive" or a "firing primitive." A primitive generally comprises a group of fluid actuators that each have a unique actuation address. In some examples, electrical and fluidic constraints of a fluidic die may limit which fluid actuators of each primitive may be actuated concurrently for a given actuation event. Therefore, primitives facilitate addressing and subsequent actuation of fluid ejector subsets that may be concurrently actuated for a given actuation event. A number of fluid ejectors corresponding to a respective primitive may be referred to as a size of the primitive.

To illustrate by way of example, if a fluidic die comprises four primitives, where each respective primitive comprises eight respective fluid actuators (each eight fluid actuator group having an address 0 to 7), and electrical and fluidic constraints limit actuation to one fluid actuator per primitive, a total of four fluid actuators tone from each primitive) may be concurrently actuated for a given actuation event. For example, for a first actuation event, the respective fluid actuator of each primitive having an address of 0 may be, actuated. For a second actuation event, the respective fluid actuator of each primitive having an address of 1 may be actuated. As will be appreciated, the example is provided merely for illustration purposes. Fluidic dies contemplated herein may comprise more or less fluid actuators per primitive and more or less primitives per die.

In examples described herein, a fluidic die may comprise an actuation data register and a mask register. The actuation data register may store actuation data that indicates each fluid actuator to actuate for a set of actuation events. The mask register may store mask data that indicates a subset of fluid actuators of the array of fluid actuators enabled for actuation for a respective actuation event of the set of actuation events. Therefore, it may be appreciated that examples contemplated herein may facilitate concurrent actuation of different arrangements of fluid actuators based on the mask data of the mask register. In some examples, the mask data may group fluid actuators in primitives, where the primitives may be identified via the mask data. Accordingly, examples described herein may facilitate variable primitive size. For example, for a first actuation event, fluid actuators may be arranged in primitives of a first primitive size, as defined by first mask data stored in the mask register, and for a second actuation event, second mask data may be loaded into the mask register such that fluid actuators may be arranged in primitives of a second primitive size.

In some examples, a fluid actuator may be disposed in a nozzle, where the nozzle may comprise a fluid chamber and a nozzle orifice in addition to the fluid actuator. The fluid actuator may be actuated such that displacement of fluid in the fluid chamber may cause ejection of a fluid drop via the nozzle orifice. Accordingly, a fluid actuator disposed in a nozzle may be referred to as a fluid ejector.

Some example fluidic dies comprise microfluidic channels. Microfluidic channels may be formed by performing etching, microfabrication (e.g., photolithography), micromachining processes, or any combination thereof in a substrate of the fluidic die. Some example substrates may include silicon based substrates, glass based substrates, gallium arsenide based substrates, and/or other such suitable types of substrates for microfabricated devices and structures. Accordingly, microfluidic channels, chambers, orifices, and/or other such features may be defined by surfaces fabricated in the substrate of a fluidic die. Furthermore, as used herein a microfluidic channel may correspond to a channel of sufficiently small size (e.g., of nanometer sized scale, micrometer sized scale, millimeter sized scale, etc.) to facilitate conveyance of small volumes of fluid (e.g., picoliter scale, nanoliter scale, microliter scale, milliliter scale, etc.). Example fluidic dies described herein may comprise microfluidic channels in which fluidic actuators may be disposed. In such implementations, actuation of a fluid actuator disposed in a microfluidic channel may generate fluid displacement in the microfluidic channel. Accordingly, a fluid actuator disposed in a microfluidic channel may be referred to as a fluid pump.

Figure 1:
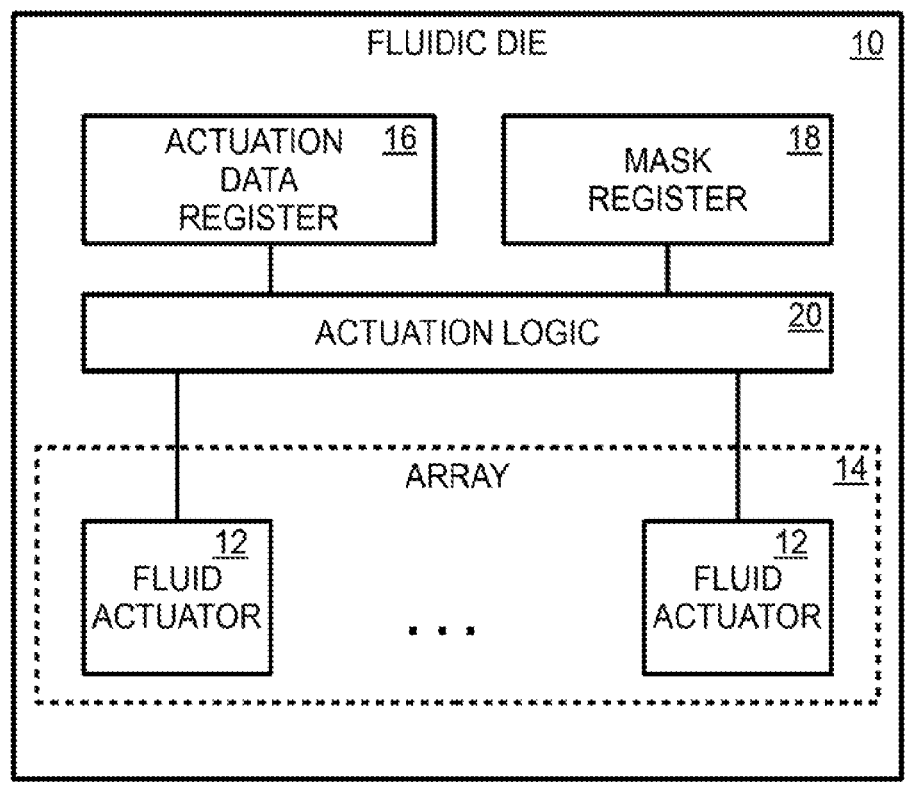
FIG. 1 is a block diagram that illustrates some components of n example fluidic die.

Turning now to the figures, and particularly to FIG. 1, this figure provides a block diagram that illustrates some components of an example fluidic die 10. As shown, the fluidic die 10 may comprise a plurality of fluid actuators 12. As discussed above, the plurality of actuators 12 may be referred to as an array of fluid actuators 14. In this example, the fluidic die 10 further comprises an actuation data register 16 and a mask register 18. As discussed previously, the actuation data register 16 may store actuation data that indicates each fluid actuator to actuate for a set of actuation events. The mask register 18 may store mask data that indicates fluid actuators of the array enabled for actuation for a respective actuation event of the set of actuation events.

Each fluid actuator 12 may be connected to actuation logic 20. In addition, the actuation logic may be connected to the actuation data register and the mask register. Accordingly, for a respective actuation event of the set of actuation events, the actuation logic 20 may electrically actuate a subset of the fluid actuators 12 based at least in part on the actuation data and the mask data. As shown in FIG. 1, the array of fluid actuators 14 may comprise various numbers of fluid actuators 12.

Figure 2:
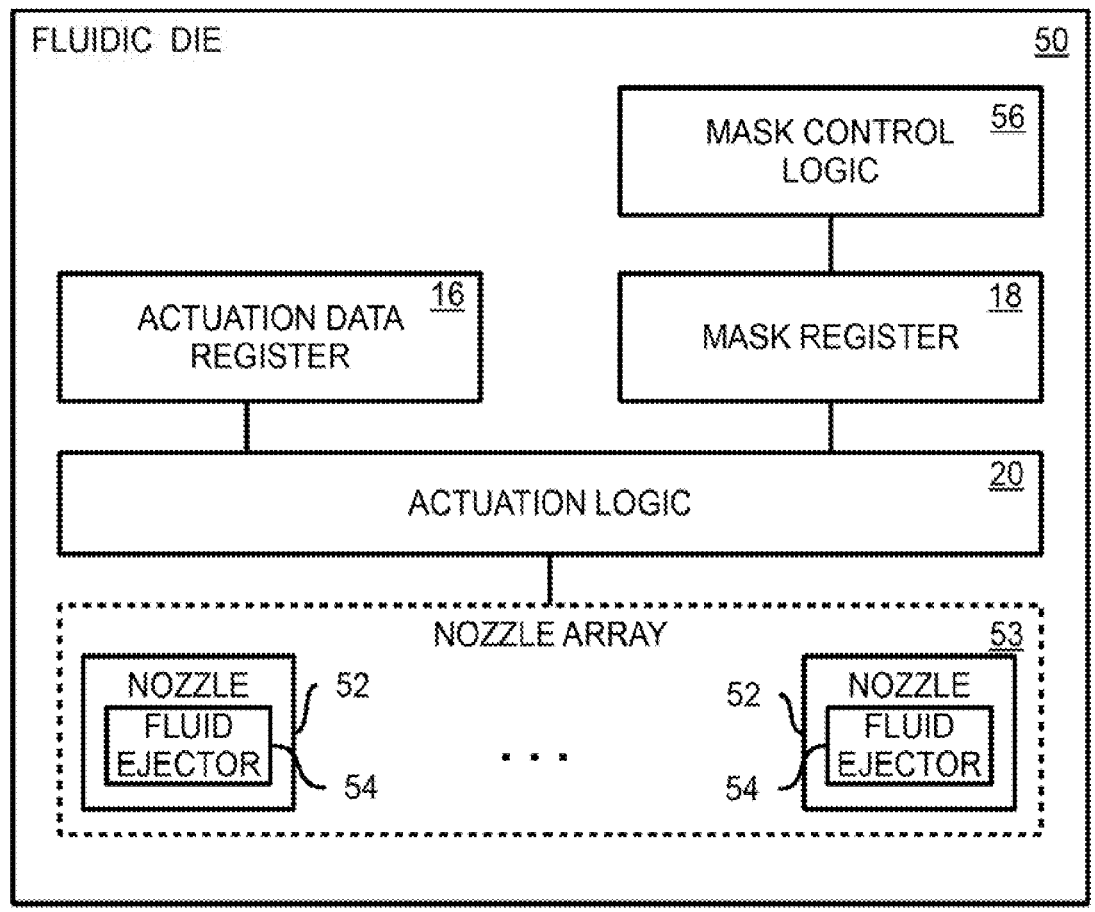
FIG. 2 is a block diagram that illustrates some components of an example fluidic die.

In FIG. 2, a block diagram is provided that illustrates some components of an example fluidic die 50. In this example, the fluidic die 50 comprises a plurality of nozzles 52, which may be referred to as, an array of nozzles 53. Moreover, each respective nozzle 52 comprises a fluid actuator in the form of a fluid ejector 54.

Furthermore, in this example, the fluidic die 50 comprises mask control logic 56 coupled to the mask register 18. In some examples described herein, the mask control logic 56 may shift mask data stored in the mask register responsive to performance of an actuation event of a set of actuation events. In such examples, by shifting the mask data, different fluid actuators of the array of fluid actuators may be subsequently enabled for actuation for a next actuation event of the set of actuation events. While in the example, each nozzle 52 is illustrated as including one fluid ejector 54, other examples may include more than one fluid ejector 54 such that different volumes of fluid may be ejected via a nozzle for a given actuation event based on the number of fluid ejectors concurrently actuated. As will be appreciated, mask data of the mask register 18 may control the number of fluid ejectors per nozzle concurrently actuated for a given actuation event.

Figure 3:
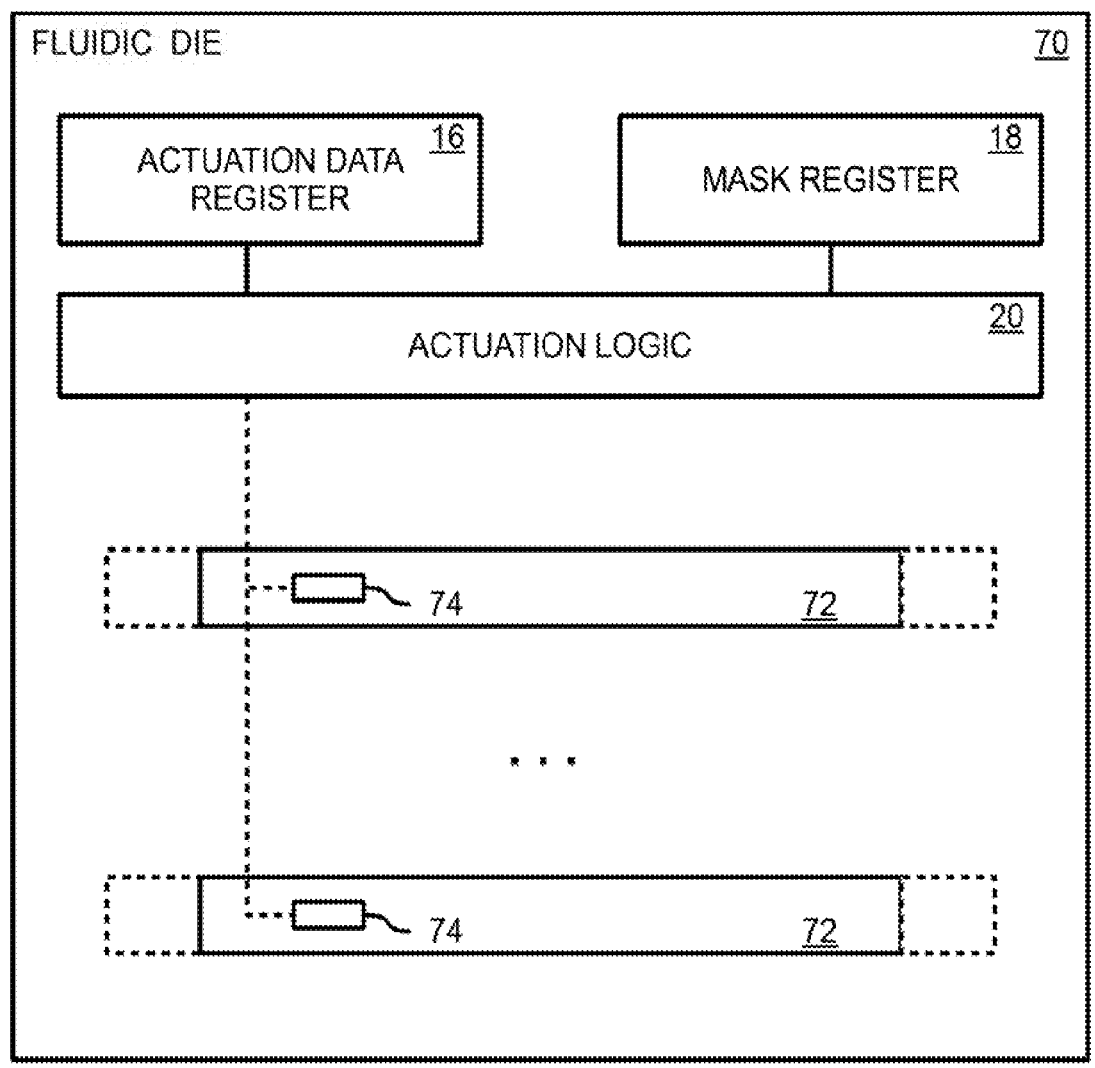
FIG. 3 is a block diagram that illustrates some components of n example fluidic die.

FIG. 3 provides a block diagram that illustrates some components of an example fluidic die 70. In this example, the fluidic die may comprise a plurality of microfluidic channels 72, which may be referred to as an array of microfluidic channels. Furthermore, in this example, a fluid actuator in the form of a fluid pump 74 may be disposed in each microfluidic channel 72. Therefore, in this example, actuation of a respective fluid pump 74 may cause displacement (i.e., flow) of fluid in the respective microfluidic channel 72. While the example of FIG. 3 illustrates one fluid pump 74 per microfluidic channel 72, other examples contemplated herein are not so limited. In particular, some example fluidic dies may comprise at least two fluid pumps disposed in each microfluidic channel. As may be appreciated, actuation of one fluid pump for a given actuation event may cause displacement of a first volume of fluid, while concurrent actuation of the at least two fluid pumps may cause displacement of a second volume of fluid that is different than the first volume of fluid. In other examples, one fluid actuator may be positioned in at least two nozzles such that fluid may be ejected from the at least two nozzles by actuation of the fluid actuator. Similarly, one fluid actuator may be positioned in at least two microfluidic channels such that fluid may be concurrently pumped in the at least two microfluidic channels by actuation of the fluid actuator.

Figure 4:
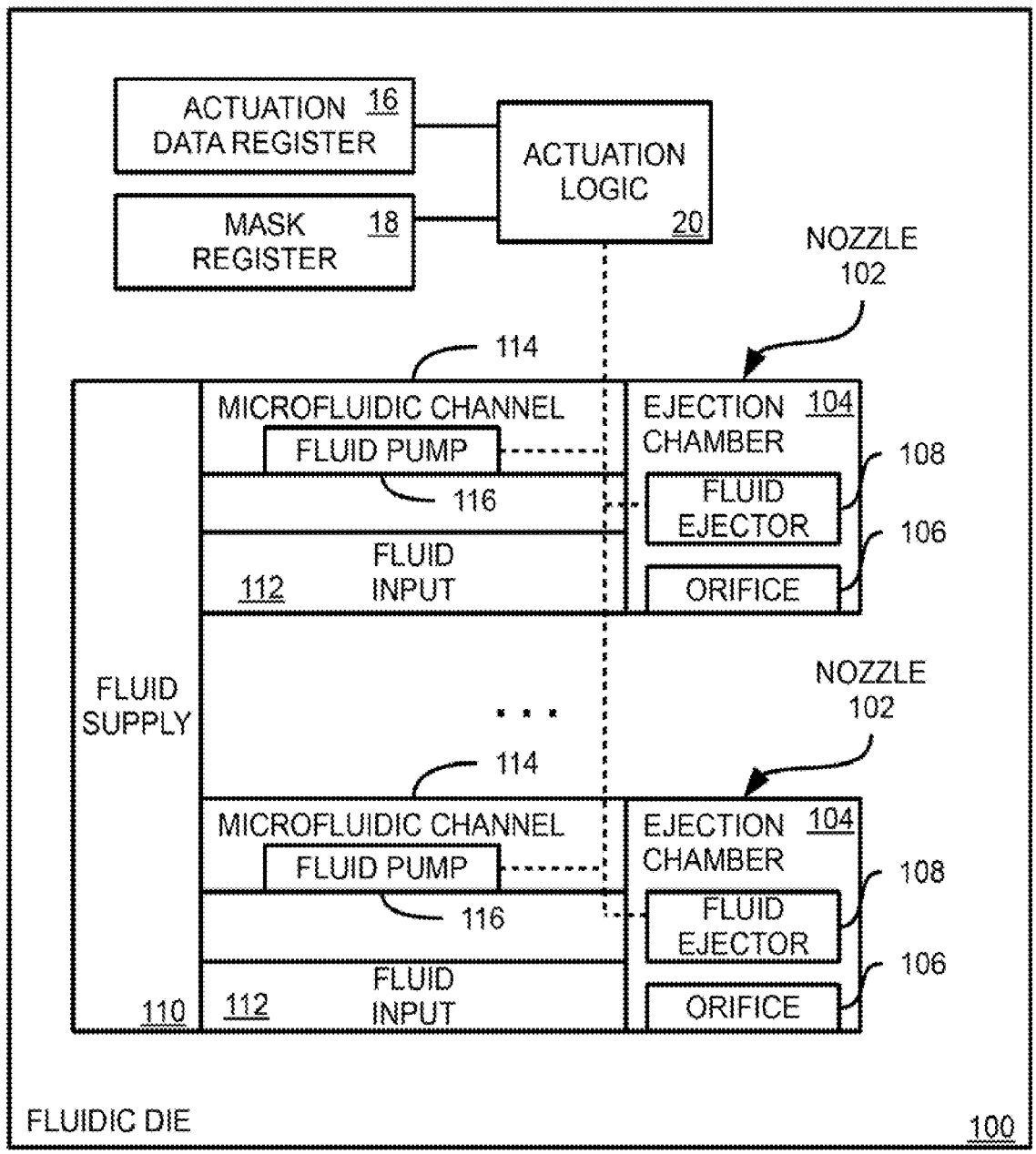
FIG. 4 is a block diagram that illustrates some components of an example fluidic die.

Turning now to FIG. 4, this figure provides a block diagram that illustrates some components of an example fluidic die 100. In this example, the fluid ejection die may comprise a plurality of nozzles 102, where each nozzle 102 comprises an ejection chamber 104, a nozzle orifice 106, and a fluid actuator in the form of a fluid ejector 108. As shown, each nozzle 102 may be fluidly connected to a fluid supply 110 via a fluid input 112. In addition, each nozzle 102 may be fluidly connected to the fluid supply 110 via a microfluidic channel 114 in which a fluid actuator in the form of a fluid pump 116 may be disposed.

In examples similar to the example fluidic die 100 of FIG. 4, fluid may be conveyed to the ejection chamber 104 of each nozzle 102 via the respective fluid input 112. Actuation of the fluid ejector 108 of each nozzle 102 may displace fluid in the ejection chamber 104 in the form of a fluid drop ejected via the nozzle orifice 106. Furthermore, fluid may be circulated from the ejection chamber 104 back to the fluid supply 110 via the microfluidic channel 114 by operation of the fluid pump 116 disposed therein. Accordingly, in such examples actuation of the fluid actuators (e.g., fluid ejectors 108 and fluid pumps 116) by the actuation logic 20 may cause fluid ejection or fluid recirculation. As with previous examples, actuation of the fluid ejectors 108 and fluid pumps 116 may be based at least in part on actuation data stored in the actuation data register 16 and mask data stored in the mask register 18 of the fluidic die 100.

Figure 5:
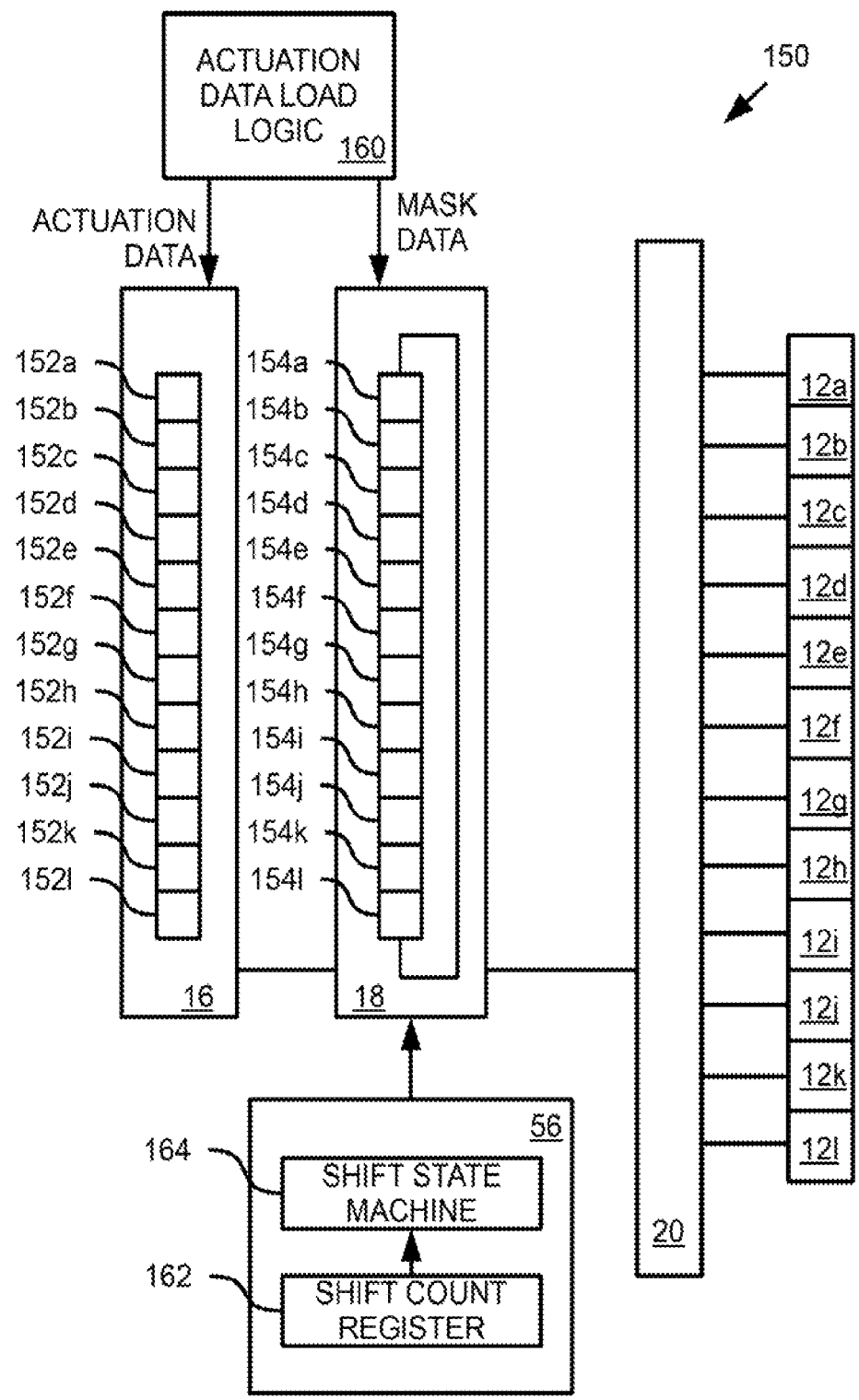
FIG. 5 is a block diagram that illustrates some components of an example fluidic die.

FIG. 5 provides a block diagram that illustrates some components of an example fluidic die 150. In this example, the die 150 comprises an actuation data register 16, a mask register 18, and actuation logic 20. The actuation logic 20 is connected to each of an array of fluid actuators 12*a-l*. Furthermore, the actuation data register 16 comprises a set of bits 152*a-l* to store actuation data, where each respective bit 152*a-l* of the actuation data register 16 corresponds to a respective fluid actuator 12*a-l*. The mask register comprises a set of bits 154*a-l* to store mask data, where each respective bit 154*a-l* of the mask register corresponds to a respective fluid actuator 12*a-l*. As shown, actuation data load logic 160 may be coupled to the actuation data register 16 and the mask register 18. The actuation data load logic 160 may receive control data corresponding to actuation events to be performed, and the actuation data load logic may load actuation data and/or mask data into the corresponding registers based on the received control data. In examples in which the fluidic die corresponds to a fluid ejection die, such as a printhead, it may be appreciated that the actuation data load logic 160 may interface with a fluid ejection system in which the fluidic die may be implemented such that the control data may be sent to, the actuation data load logic from the system in which the fluidic die may be implemented.

Furthermore, in this example, the fluidic die 150 includes mask control logic 56 that comprises a shift count register 162 and a shift state machine 164. The shift count register 162 may store a shift pattern that indicates a number of shifts that may be input, into the mask register 18 responsive to performance of an actuation event to cause the mask data of the mask register to shift. The shift state machine 164 may input a shift clock to the mask register to cause the shifting indicated in the shift count register. In this example, the mask register 18 is illustrated as a circular shift register in which shifting of bits of the register may cause end bits to be shifted from one end of the register to the other (i.e., a value of the first mask bit 154*a* may be shifted into the last mask bit 154*l*, or a value of the last mask bit 154*l* may be shifted into the first mask bit 154*a*). Other examples may comprise other types of shift registers including more or less mask bits. In some examples, the mask register may comprise more bits than fluid actuators, such that some mask bits may not be used in arranging the fluid actuators into virtual primitives. In other examples, the additional mask bits may be used to implement various other functionalities.

As shown in examples provided in FIGS. 1-5, the fluidic die may comprise various components that may be used to process data and perform operations as described herein. Such components, such as actuation logic, mask control logic, and/or actuation data load logic may comprise various arrangements of logical components to perform the operations described herein. For example, arrangements of transistors, switches, state machines, registers, counters, multiplexers, logic gates, and/or other such logical components may be implemented therein. Moreover, it may be appreciated that the components may further include circuitry for data, processing, such as controllers, processing units, and/or other such types of circuit arrangements that may be implemented for data processing.

Examples provided herein may facilitate a variable primitive size for fluid actuator arrays of a fluidic die. FIGS. 6A-C illustrate example prim sizes that may be implemented for a fluidic die 200 comprising a fluid actuator array having twelve fluid actuators 12*a-l*. In this example, the fluidic die 200 includes an actuation data register 16 that includes an actuation bit 202*a-l* for each respective fluid actuator 12*a-l*. The respective actuation bit 202*a-l* indicates whether the associated fluid actuator 12*a-l* is to be actuated for a set of actuation events. For the examples of FIGS. 6A-C, every fluid actuator 12*a-l* is to be actuated for the set of actuation events—i.e., each actuation bit 202*a-l* includes a bit value of '1'.

Furthermore, the fluidic die 200 includes a mask register 18 that comprises a respective mask bit 204*a-l* for each respective fluid actuator. As discussed previously, actuation logic 20 of the fluidic die 200 may selectively actuate a respective fluid actuator based at least in part on a respective actuation data bit 202*a-l* and a respective mask bit 204*a-l*. In the examples of FIGS. 6A-C, the fluidic die 200 comprises a first actuation data bit 202*a* and a first mask bit 204*a* for a first fluid actuator 12*a*, and the fluidic die 200 comprises a respective actuation data bit and mask bit for each respective fluid actuator to the 12th actuation data bit 202*l* and 12th mask bit 204*l* for a 12th fluid actuator 12*l* of the array of fluid actuators.

In FIG. 6A, the mask data of the mask register 18 configures the fluidic die 200 to actuate the fluid actuators 12*a-l* in a primitive size of 3 actuators per primitive, such that the fluid actuators are arranged into four primitives. In particular, a first primitive may include the first fluid actuator 12*a*, the second fluid actuator 12*b*, and the third fluid actuator 12*c*; a second primitive may include the fourth fluid actuator 12*d*, the fifth fluid actuator 12*e*, and the sixth fluid actuator 12*f*; a third primitive may include the seventh fluid actuator 12*g*, the eighth fluid actuator 12*h*, and the ninth fluid actuator 12*i*; a fourth primitive may include the tenth fluid actuator 12*j*, the eleventh fluid actuator 12*k*, and the twelfth fluid actuator 12*l*.

In this example, one respective fluid actuator of each primitive may be actuated for a respective actuation event. Since the mask data 18 causes the fluid actuators 12*a-l* to be operated into four primitives having a primitive size of three fluid actuators, the set of actuation events to perform the actuations indicated in the actuation data register 16 may be three actuation events.

In FIG. 6A, a first actuation event of the set of actuation events is illustrated by the mask data bits 204*a-l*. In particular, for the first actuation event, the mask data of the mask register 18 identifies a set of fluid actuators enabled for actuation. In this example, for the first primitive, the first fluid actuator 12*a* is enabled for actuation, as indicated by the first mask bit 204*a*; for the second primitive, the fourth fluid actuator 12*d* is enabled for actuation, as indicated by the fourth mask bit 204*d*; for the third primitive, the seventh fluid actuator 12*g* is enabled for actuation, as indicated by the seventh mask bit 204*g*; and for the fourth primitive, the tenth fluid actuator 202*j* is enabled for actuation, as indicated by the tenth mask bit 204*j*. After performance of the first actuation event, the mask data of the mask register 18 may be shifted such that the set of fluid actuators enabled for actuation for the second actuation event includes a different fluid actuator 12*a-l* of each primitive. After performance of the second actuation event, the mask data of the mask register 18 may be shifted such the set of fluid actuators enabled for actuation for the third actuation event includes a different fluid actuator 12*a-l* of each primitive.

In the example of FIG. 6B, the mask data of the mask register 18 arranges the fluid actuators 12*a-l* in three primitives with each primitive having a primitive size of four fluid actuators 12*a-l*. In particular, a first primitive may include the first through fourth fluid actuators 12*a-d*; a second primitive may include the fifth through eighth fluid actuators 12*e-h*; and a third primitive may include the ninth through twelfth fluid actuators 12*i-l*. Since each primitive size is four fluid actuators, the set of actuation events corresponding to the primitive size arranged by the mask data of the mask register 18 may include four actuation events. In this example, the mask bits 204*a-l* of the mask register 18 store mask data for a first actuation event of the set of actuation events. In particular, in this example, one fluid actuator 12*a-l* of each primitive may be actuated per actuation event. The mask data illustrated in the example of FIG. 68 corresponds to a first actuation event, in which: the first fluid actuator 12*a* is enabled for actuation, as indicated by the first mask bit 204*a*; the fifth fluid actuator 12*e* is enabled for actuation, as indicated by the fifth mask bit 204*e*; and the ninth fluid actuator 12*i* is enabled for actuation, as indicated by the ninth mask bit 204*i*. Similar to the example of FIG. 6A, after performance of each respective actuation event of the set of actuation events, the mask data of the mask register may be shifted such that a different fluid actuator 12*a-l* of each primitive is enabled for actuation for subsequent actuation events. After performance of the set of actuation events, some examples may load new mask data that corresponds to a different arrangement of fluid actuators. In other examples, after performance of the set of actuation events, the mask data may be shifted to thereby reset such that the primitive arrangement may be implemented for another set of actuation events.

In FIG. 6C, the mask data of the mask register 18 arranges the fluid actuators 12a-l in two primitives with each primitive having a primitive size of six fluid actuators 12a-l. In particular, a first primitive may include the first through sixth fluid actuators 12a-f; and a second primitive may include the seventh through twelfth fluid actuators 12g-l. Since each primitive size is six fluid actuators, the set of actuation events corresponding to the primitive size arranged by the mask data of the mask register 18 may include six actuation events. In this example, the mask bits 204a-l of the mask register 18 store mask data for a first actuation event of the set of actuation events. In particular, in this example, one fluid actuator 12a-l of each primitive may be actuated per actuation event. The mask data illustrated in the example of FIG. 6C corresponds to a first actuation event, in which: the first fluid actuator 12a is enabled for actuation, as indicated by the first mask bit 204a; and the seventh fluid actuator 12g is enabled for actuation, as indicated by the seventh mask bit 204g. Similar to the example of FIGS. 6A and 6B, after performance of each respective actuation event of the set of actuation events, the mask data of the mask register may be shifted such that a different fluid actuator 12a-l of each primitive is enabled for actuation for subsequent actuation events.

FIGS. 7A-C continue the example of FIG. 6B. As discussed above with regard to FIG. 6B, the mask data of the mask register 18 may arrange the fluid actuators 12a-l in primitives having a primitive size of four fluid actuators each such that the set of actuation events may comprise four respective actuation events. FIG. 6B illustrates the mask data of the mask register 18 for the first actuation event of the set. In FIG. 7A, the mask data of the mask register 18 has been shifted up two times (from the example of FIG. 6B) to enable different fluid actuators of each primitive for actuation for a second actuation event of the set. In particular, in this example, the third fluid actuator 12c is enabled for actuation, as indicated by the third mask bit 204c; the seventh fluid actuator 12g is enabled for actuation, as indicated by the seventh mask bit 204g; and the eleventh fluid actuator 12k is enabled for actuation, as indicated by the eleventh mask bit 204k.

In FIG. 7B, the mask data of the mask register 18 has been shifted up one times (from the example of FIG. 7A) to enable different fluid actuators of each primitive for actuation for a third actuation event of the set. In particular, in this example, the second fluid actuator 12b is enabled for actuation, as indicated by the second mask bit 204b; the sixth fluid actuator 12f is enabled for actuation, as indicated by the sixth mask bit 204f; and the tenth fluid actuator 12j is enabled for actuation, as indicated by the tenth mask bit 204j.

In FIG. 7C, the mask data of the mask register has been shifted up two times (from the example of FIG. 7B) to enable different fluid actuators of each primitive for actuation for a fourth actuation event of the set. In particular, in this example, the fourth fluid actuator 12d is enabled for actuation, as indicated by the fourth mask bit 204d; the eighth fluid actuator 12h is enabled for actuation, as indicated by the eighth mask bit 204h; and the twelfth fluid actuator 12l is enabled for actuation, as indicated by the twelfth mask bit 204l.

Accordingly, the example provided by FIGS. 6B and 7A-C illustrate shifting of the mask data in the mask register 18 responsive to performance of each respective actuation event for a set of actuation events. As discussed, in such examples by shifting the mask data, each fluid actuator 12a-l of each primitive may be enabled for actuation for the set of actuation events. In some examples, such as the examples of FIGS. 6B, and 7A-C, each respective fluid actuator 12a-l of each primitive is enabled for actuation for a different actuation event of the set of actuation events.

In other examples, more than one fluid actuator of a primitive may be enabled for a given actuation event. For example, referring to FIG. 8, in this example, two fluid actuators per primitive may be enabled for actuation for a given actuation event. In this example, to facilitate displacement of a larger volume of fluid, at least two neighboring fluid actuators may be concurrently actuated for an actuation event. In particular, the first fluid actuator 12a and second fluid actuator 12b are enabled for actuation, as indicated by the first mask bit 204a and the second mask bit 204b; the fifth and sixth fluid actuators 12e, 12f are enabled for actuation, as indicated by the fifth and sixth mask bits 204e, 204f; and the ninth and tenth fluid actuators 12i, 12j are enabled for actuation, as indicated by the ninth and tenth mask bits 204i, 204j.

Figure 8:
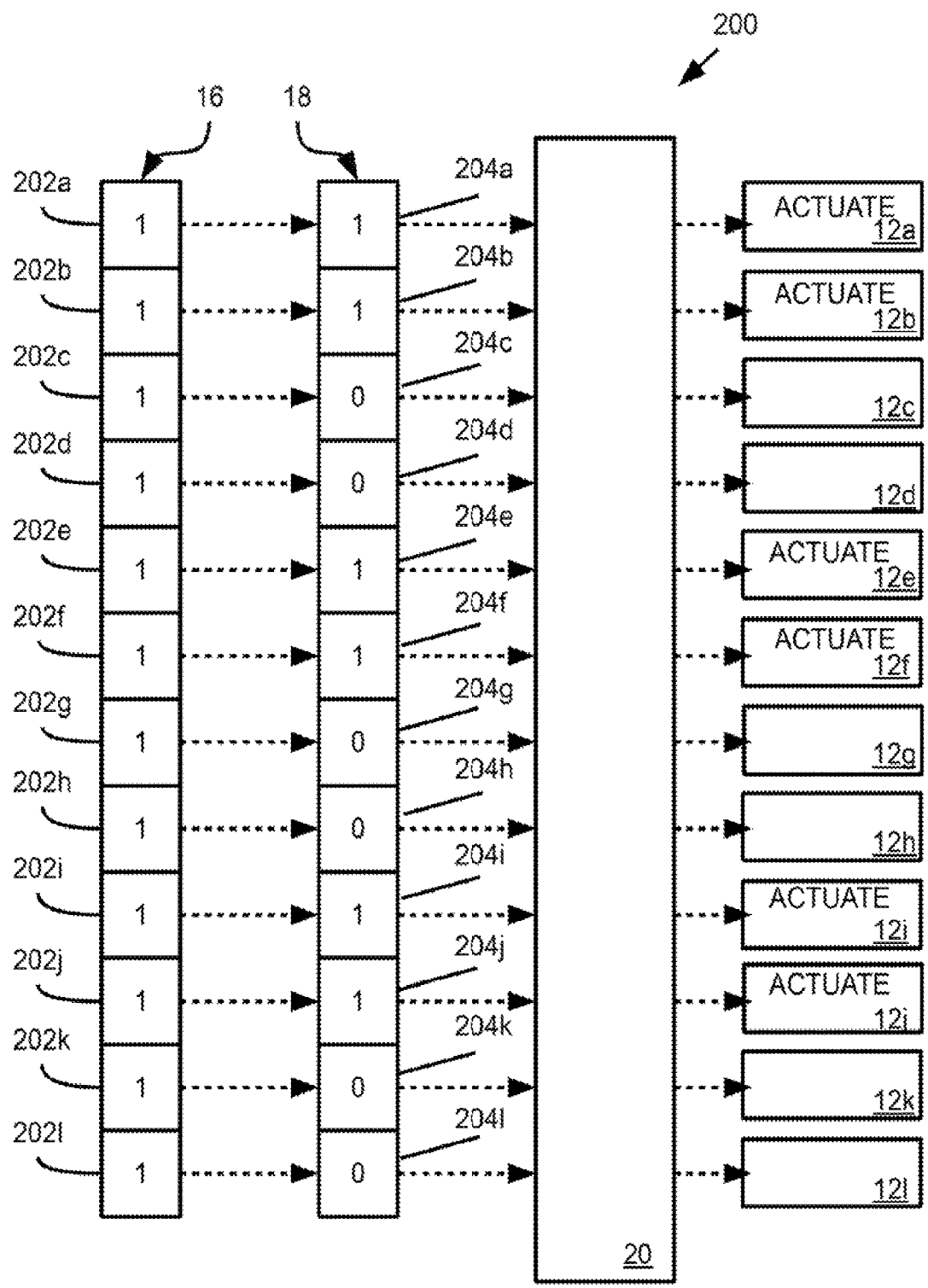

In examples in which the fluid actuators 12a-l are implemented in nozzles as fluid ejectors, arrangement similar to the example arrangement of FIG. 8 may facilitate ejection of a fluid drop having a greater volume, as the fluid drops from neighboring nozzles may combine. To illustrate by way of comparison, in the example of FIG. 8B, a first drop volume (which may also be referred to as a first drop size) may be ejected since the mask data (for example purposes, first mask data) of the mask register 18 implements actuation of one fluid actuator per primitive. By comparison, the arrangement of FIG. 8 may cause ejection of a fluid drop of a second volume (which may also be referred to as a second drop size) since the mask data (for example purposes, second mask data) of the mask register 18 implements actuation of two fluid actuators per primitive. In other examples, fluid displacement in a microfluidic channel or overall fluidic die may be selectively controlled by actuation of one fluid actuator per primitive or concurrent actuation of more than one fluid actuator per primitive. Therefore, examples provided herein may selectively change fluid volume displacement (either in drop ejection or channel pumping) by loading different mask data that facilitates different arrangements of primitives for the fluid actuators.

While other examples provided herein have illustrated operations in which each fluid actuator of an array is to be actuated for a set of actuation events, the description is not so limited. As described herein, the mask data of the mask register enables a fluid actuator for actuation for a given actuation event. However, a fluid actuator may not actuate for the given actuation event if the actuation data of the actuation data register does not indicate that the fluid actuator is to actuate for the set of actuation events. FIG. 9 provides an example in which the mask data arranges the fluid actuators 12a-l into four primitives having a primitive size of three fluid actuators each 12a-l. In this example, the first fluid actuator 12a will actuate for the respective actuation event because: the first actuation data bit 202a indicates that it is to actuate for the set of actuation events (in this example, the bit is set to logic value '1'); and the first mask bit 204a indicates that the first fluid actuator 12a is enabled for actuation for the respective actuation event. To illustrate the opposite, while the fourth fluid actuator 12d is enabled for actuation for the respective actuation event (i.e., the fourth mask bit 204d is set to logic value '1'), the fourth fluid actuator will not actuate for the respective actuation event because the fourth actuation data bit 202d indicates that the fourth fluid actuator 12d is not to actuate for the set of actuation events (e.g., the fourth actuation data bit 202d is set to logic value '0'). Accordingly, it may be appreciated that whether a respective fluid actuator is actuated by the actuation logic 20 is based at least in part on both the actuation data of the actuation data register 16 and the mask data of the mask register 18. In some examples, the actuation logic 20 may comprise at least some logical components that perform a logical 'AND' operation with a respective actuation data bit and a respective mask bit for a respective fluid actuator.

FIG. 10 provides a flowchart 300 that illustrates an example sequence of operations that may be performed by an example fluidic die. The operations illustrated in the example of FIG. 9 may be performed by components of a fluidic die, such as mask control logic, actuation logic, actuation data load logic, fluid actuators, or other such components. In this example, the actuation data register and mask register may initialized for a set of actuation events (block 302). In some examples, initializing the mask register may comprise loading mask data into the mask register. In some examples, initializing the mask register may comprise shifting the mask register such that the mask data corresponds to a respective actuation event of the set of actuation events. Furthermore, initializing the actuation register may comprise loading actuation data into the actuation data register of the fluidic die for the set of actuation events. As discussed previously, the actuation data of the actuation data register may indicate fluid actuators of the fluidic die to be actuated for the set of actuation events, and the mask data of the mask register indicates a set of fluid actuators of the die enabled to be actuated for a respective actuation event of the set of actuation events.

Accordingly, fluid actuators of the fluidic die may be actuated for the respective actuation event, where such actuation is based at least in part on the actuation data and the mask data (block 306). Responsive to performance of the respective actuation event and if other actuation events of the set of actuation events remain to be performed ("N" branch of block 308), the mask data of the mask register may be shifted such that different fluid actuators of the fluidic die are enabled for actuation for a next actuation event of the set of actuation events (block 310), and the sequence of operations may repeat (blocks 308-310) until all actuation events of the set of actuation events are performed. Responsive to completing the set of actuation events ('Y' branch of block 308), the actuation register and/or mask register may be initialized for a next set of actuation events (block 312). As discussed above, initializing the mask register may comprise loading mask data into the mask register for a respective actuation event of the next set of actuation events. In addition, initializing the mask register may comprise shifting the mask register such that the mask data corresponds to the respective actuation event of the next set of actuation events. Furthermore, initializing the actuation register may comprise loading actuation data for the next set of actuation events into the actuation data register. The operations may be repeated for the next set of actuation events (blocks 306-314).

Accordingly, examples provided herein may provide a fluidic die including an actuation data register and a mask register that may be used to control actuation of fluid actuators of the fluidic die. As described in the various examples provided herein, the mask register may be utilized to arrange fluid actuators in variable primitives such that actuation of the fluid actuators thereof may be adjusted by adjusting mask data of the mask register. As illustrated by way of various examples, adjustable primitive arrangement of the fluid actuators of the fluidic die may facilitate changing such fluid actuator arrangements based on parameters of a set of actuation events.

The preceding description has been presented to illustrate and describe examples of the principles described. This description is not intended to be exhaustive or to limit these principles to any precise form disclosed. Many modifications and variations are possible in light of the description. In addition, while various examples are described herein, elements and/or combinations of elements may be combined and/or removed for various examples contemplated hereby. For example, the example operations provided herein in the flowcharts of FIG. 10 may be performed sequentially, concurrently, or in a different order. Moreover, some example operations of the flowcharts may be added to other flowcharts, and/or some example operations may be removed from flowcharts. In addition, the components illustrated in the examples of FIGS. 1-9 may be added and/or removed from any of the other figures. Therefore, the foregoing examples provided in the figures and described herein should not be construed as limiting of the scope of the disclosure, which is defined in the Claims.

The invention claimed is:

1. A fluidic die comprising:
   an array of fluid actuators;
   an actuation data register to store actuation data that indicates each fluid actuator to actuate for a set of actuation events;
   a mask register to store mask data that indicates a set of fluid actuators of the array of fluid actuators enabled for actuation for a respective actuation event of the set of actuation events; and
   actuation logic coupled to the actuation data register, the mask register, and the respective fluid actuators, the actuation logic to electrically actuate a subset of the fluid actuators based at least in part on the actuation data register and the mask register for the respective actuation event,
   wherein the fluidic die includes the array of fluid actuators, the actuation data register, the mask register and the actuation logic.

2. The fluidic die of claim 1, further comprising:
   an array of nozzles, wherein each respective nozzle of the array comprises a respective fluid actuator of the array of fluid actuators as a respective fluid ejector, and each respective fluid ejector is to actuate to thereby eject a fluid drop via the respective nozzle of the array of nozzles.

3. The fluidic die of claim 1, further comprising:
   an array of microfluidic channels, wherein each respective microfluidic channel of the array comprises a respective fluid actuator of the array of fluid actuators disposed therein as a respective fluid pump, and each respective fluid pump is to actuate to thereby generate fluid displacement in the respective microfluidic channel.

4. The fluidic die of claim 1, further comprising:
   an array of nozzles, wherein each respective nozzle of the array comprises a first respective fluid actuator of the array of fluid actuators as a respective fluid ejector, and each respective fluid ejector is to actuate to thereby eject a fluid drop via the respective nozzle of the array of nozzles; and
   an array of microfluidic channels, wherein each respective microfluidic channel of the array comprises a second respective fluid actuator of the array of fluid actuators disposed therein as a respective fluid pump, each respective microfluidic channel is fluidly connected to at least one respective nozzle, and each respective fluid pump is to actuate to thereby generate fluid displacement in the respective microfluidic channel and connected at least one respective nozzle.

5. The fluidic die of claim 1 further comprising:
mask control logic to shift the mask data stored in the mask register responsive to the respective actuation event to thereby indicate another subset of fluid actuators enabled for actuation for another respective actuation event of the set of actuation events.

6. The fluidic die of claim 5, wherein the mask control logic comprises a shift count register and a shift state machine, the shift state machine connected to the mask register, and the shift state machine to input a shift clock to the mask register to shift the mask data stored in the mask register.

7. The fluidic die of claim 1, wherein the mask data is first mask data, and the first mask data corresponds to a first primitive size,
wherein the mask register is to store second mask data that indicates another subset of fluid actuators of the array of fluid actuators enabled for actuation for another respective actuation event of another set of actuation events, and the second mask data corresponds to a second primitive size that is different than the first primitive size.

8. The fluidic die of claim 1, wherein the mask data is first mask data, and the first mask data corresponds to a first fluid drop size,
wherein the mask register is to store second mask data that indicates another subset of fluid actuators of the array of fluid actuators enabled for actuation for another respective actuation event of another set of actuation events, and the second mask data corresponds to a second fluid drop size that is different than the first fluid drop size.

9. The fluidic die of claim 1, wherein the mask data is first mask data, and the fluid ejection die further comprises:
mask control logic coupled to the mask register, the mask control logic to load second mask data into the mask register responsive to completion of the set of actuation events.

10. The fluidic die of claim 1, wherein the actuation data register includes a respective bit for each respective fluid actuator, and the mask register includes a respective bit for each respective fluid actuator, and
wherein the actuation logic to electrically actuate the subset of respective fluid actuators comprises the actuation logic to electrically actuate the respective fluid actuators based at least in part on the respective bit of the actuation data register and the respective bit of the mask register.

11. A fluidic die comprising:
an array of fluid actuators;
an actuation data register including a respective actuation bit for each respective fluid actuator of the array of fluid actuators, the respective actuation bit indicating whether to actuate the respective fluid actuator for a set of actuation events;
a mask register to store mask data, the mask register including a respective mask bit for each respective fluid actuator of the array of fluid actuators, the respective mask bit indicating whether the respective fluid actuator is enabled for actuation for a respective actuation event of the set of actuation events; and
actuation logic coupled to the actuation data register, the mask register, and the array of fluid actuators, the actuation logic to actuate fluid actuators of the array based at least in part on the respective actuation bit and the respective mask bit for each respective fluid actuator for the respective actuation event,
wherein the fluidic die includes the array of fluid actuators, the actuation data register, the mask register and the actuation logic.

12. The fluidic die of claim 11, wherein the mask data is first mask data, and the set of actuation events is a first set of actuation events that corresponds to the first mask data, the fluidic die further comprising:
mask control logic to:
shift the first mask data of the mask register responsive to performance of each respective actuation event of the first set of actuation events, and
load second mask data corresponding to a second set of actuation events responsive to performance of the respective actuation events of the first set of actuation events.

13. A method for a fluidic die comprising:
actuating fluid actuators of an array of fluid actuators for a first actuation event of a set of actuation events based at least in part on actuation data stored in an actuation register of the fluidic die and based at least in part on mask data stored in a mask register of the fluidic die, the actuation data indicating each respective fluid actuator of the array to actuate for the set of actuation events, and the mask data indicating a first subset of respective fluid actuators of the array enabled for actuation for the first actuation event; and
responsive to actuating the fluid actuators for the first actuation event, shifting the mask data of the mask register to indicate a second subset of respective fluid actuators of the array enabled for actuation for a second actuation event of the set of actuation events,
wherein the fluidic die includes the array of fluid actuators, the actuation data register, the mask register and the actuation logic.

14. The method of claim 13, wherein the set of actuation events is a first set of actuation events, the method further comprising:
responsive to performing all actuation events of the first set of actuation events, loading the mask register for a first actuation event of a second set of actuation events.

15. The method of claim 14, wherein the fluidic die comprises an array of nozzles, and each respective fluid actuator of the array of fluid actuators is disposed in a respective nozzle of the array of nozzles.

\* \* \* \* \*